(12) United States Patent
Fujita et al.

(10) Patent No.: US 7,277,341 B2
(45) Date of Patent: Oct. 2, 2007

(54) SEMICONDUCTOR MEMORY DEVICE

(75) Inventors: Katsuyuki Fujita, Yokohama (JP);
Kosuke Hatsuda, Tokyo (JP); Takashi Ohsawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/444,487

(22) Filed: Jun. 1, 2006

(65) Prior Publication Data
US 2006/0274590 A1 Dec. 7, 2006

(30) Foreign Application Priority Data
Jun. 2, 2005 (JP) .............................. 2005-162828

(51) Int. Cl.
*G11C 7/00* (2006.01)
*G11C 8/00* (2006.01)

(52) U.S. Cl. .................. 365/206; 365/207; 365/189.05

(58) Field of Classification Search ................ 365/206, 365/207, 189.05, 208
See application file for complete search history.

(56) References Cited

U.S. PATENT DOCUMENTS

| 6,567,330 B2 | 5/2003 | Fujita et al. |
| 6,781,903 B2 * | 8/2004 | Mangyo et al. ............. 365/203 |
| 7,023,752 B2 * | 4/2006 | Ohsawa ...................... 365/205 |

| 2005/0232043 A1 | 10/2005 | Ohsawa |
| 2006/0044794 A1 | 3/2006 | Hatsuda et al. |
| 2006/0274590 A1 | 12/2006 | Fujita et al. |

OTHER PUBLICATIONS

Takashi Ohsawa, et al., "An 18.5ns 128Mb SOI DRAM with a Floating Body Cell", ISSCC Digest of Technical Papers, Session 25, Dynamic Memory, 25.1, Feb. 9, 2005, pp. 458-459.
U.S. Appl. No. 11/673,750, filed Feb. 12, 2007, Ohsawa.
U.S. Appl. No. 11/680,999, filed Mar. 1, 2007, Fujita.

* cited by examiner

*Primary Examiner*—Son Dinh
(74) *Attorney, Agent, or Firm*—Oblon, Spivak, McClelland, Maier & Neustadt, P.C.

(57) ABSTRACT

A semiconductor memory device has first and second sense nodes which are provided corresponding to first and second bit lines, and a sense amplifier which is connected to the first and second sense nodes and senses data read out from a memory cell, wherein the sense amplifier includes an initial sense circuit which increases a potential difference between the first and second sense nodes in a first period after beginning sense operation, and a latch circuit which increases and holds the potential difference between the first and second sense nodes in a second period after the first period, wherein the initial sense circuit includes first and second transistors of first conductive type, third and fourth transistors of first conductive type, and fifth and sixth transistors of first conductive type, wherein the latch circuit includes seventh and eighth transistors of first conductive type, and ninth and tenth transistors of second conductive type.

18 Claims, 17 Drawing Sheets

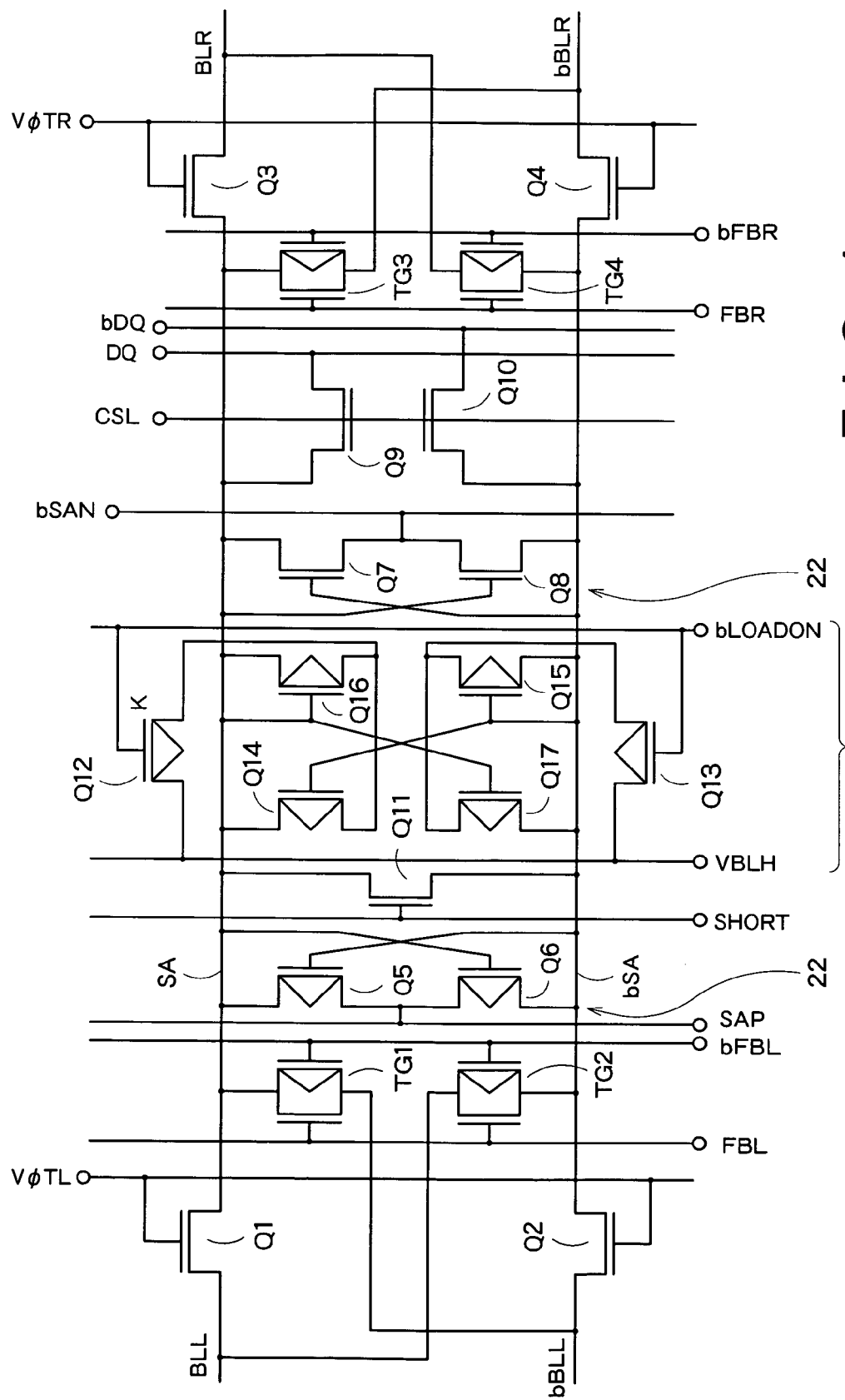
F I G. 1

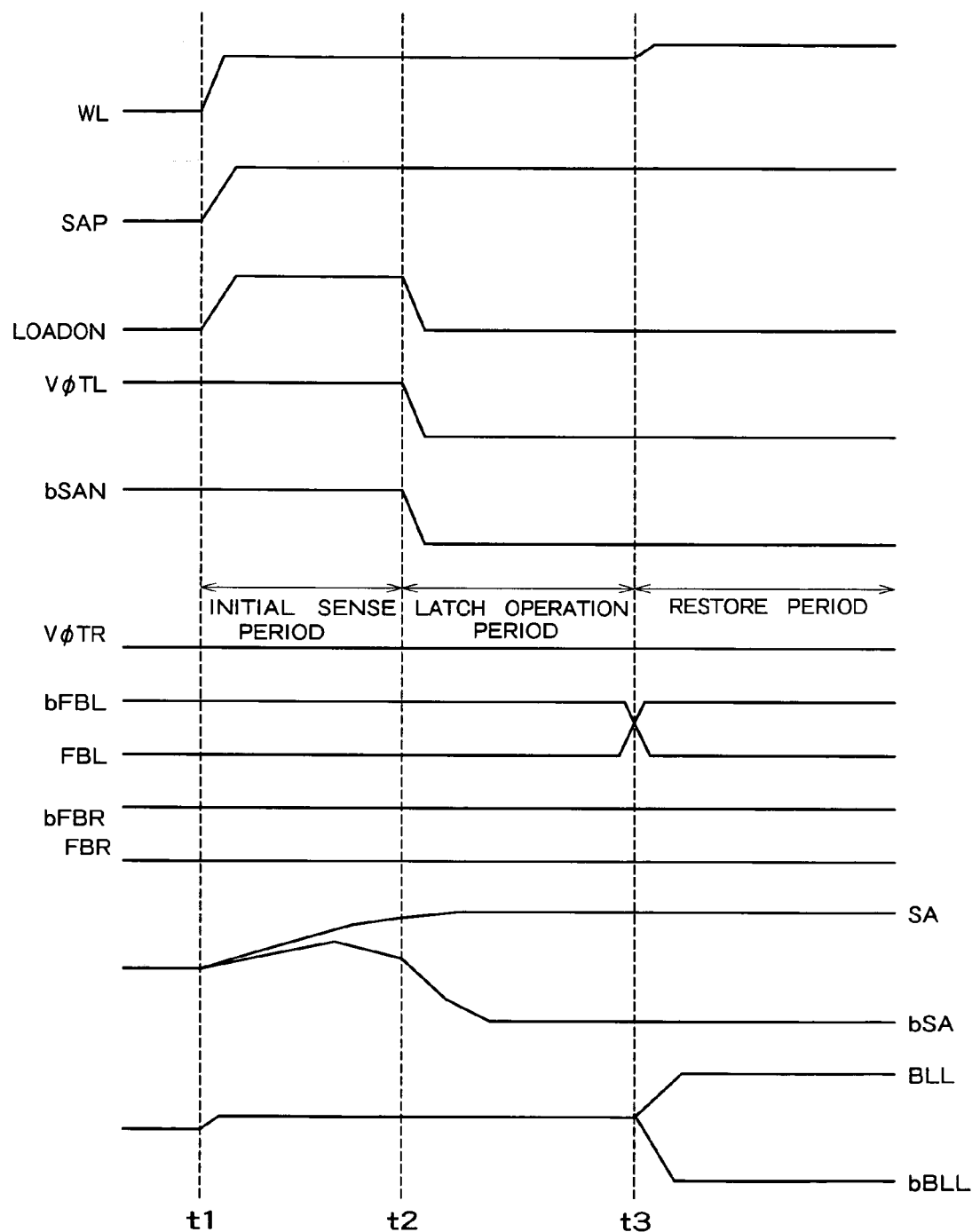
F I G. 11

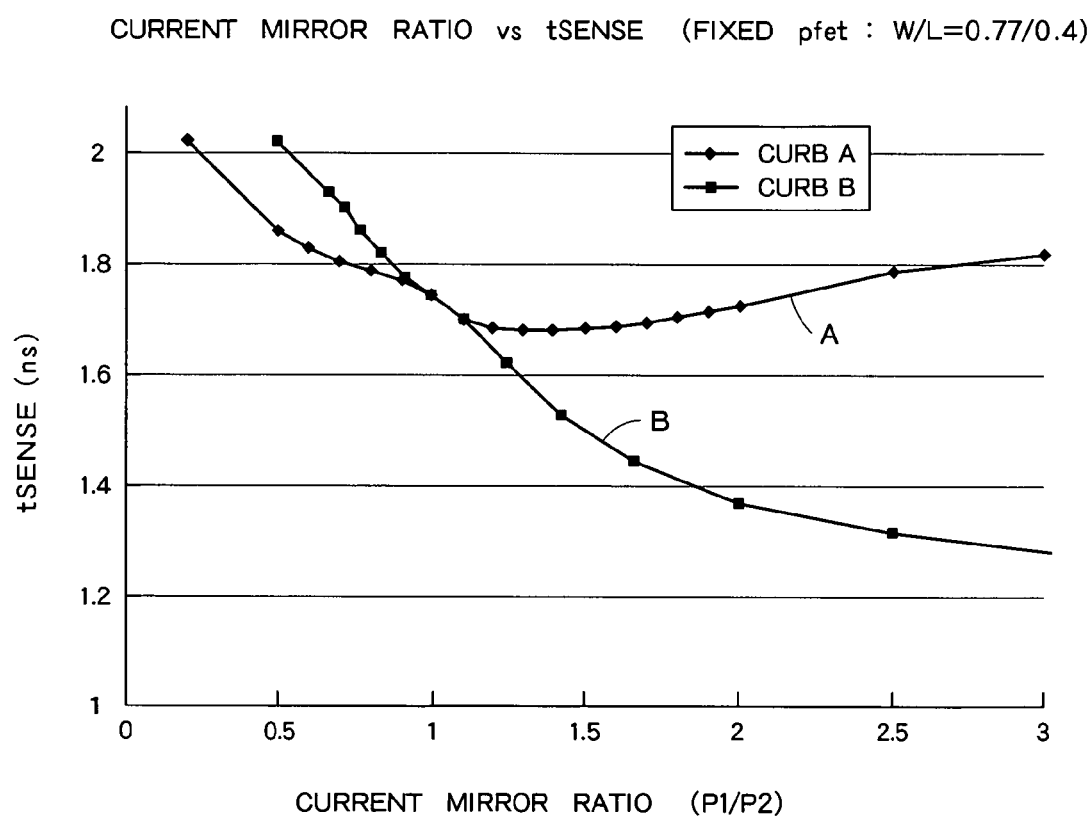
F I G. 12

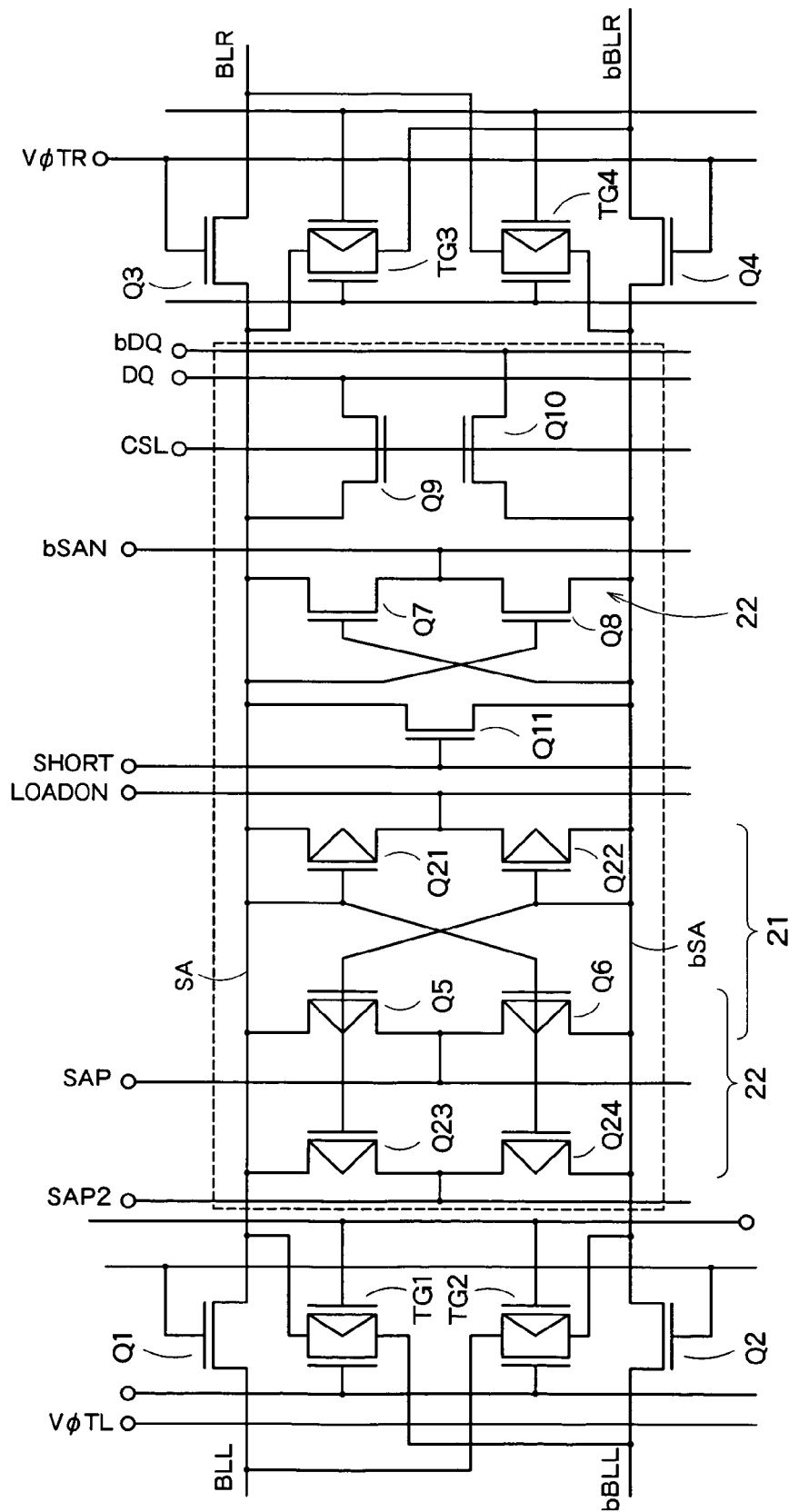
F I G. 13

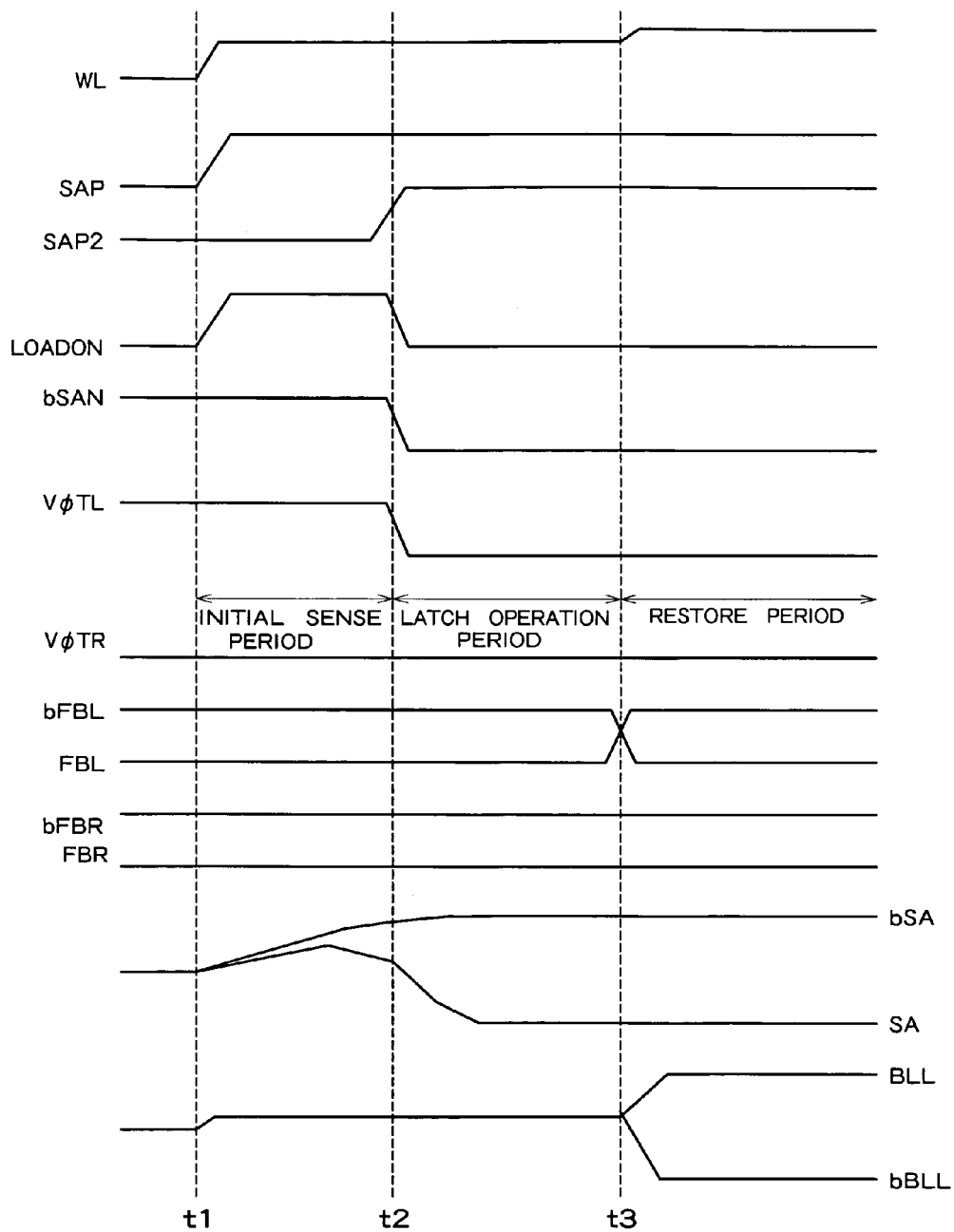
F I G. 14

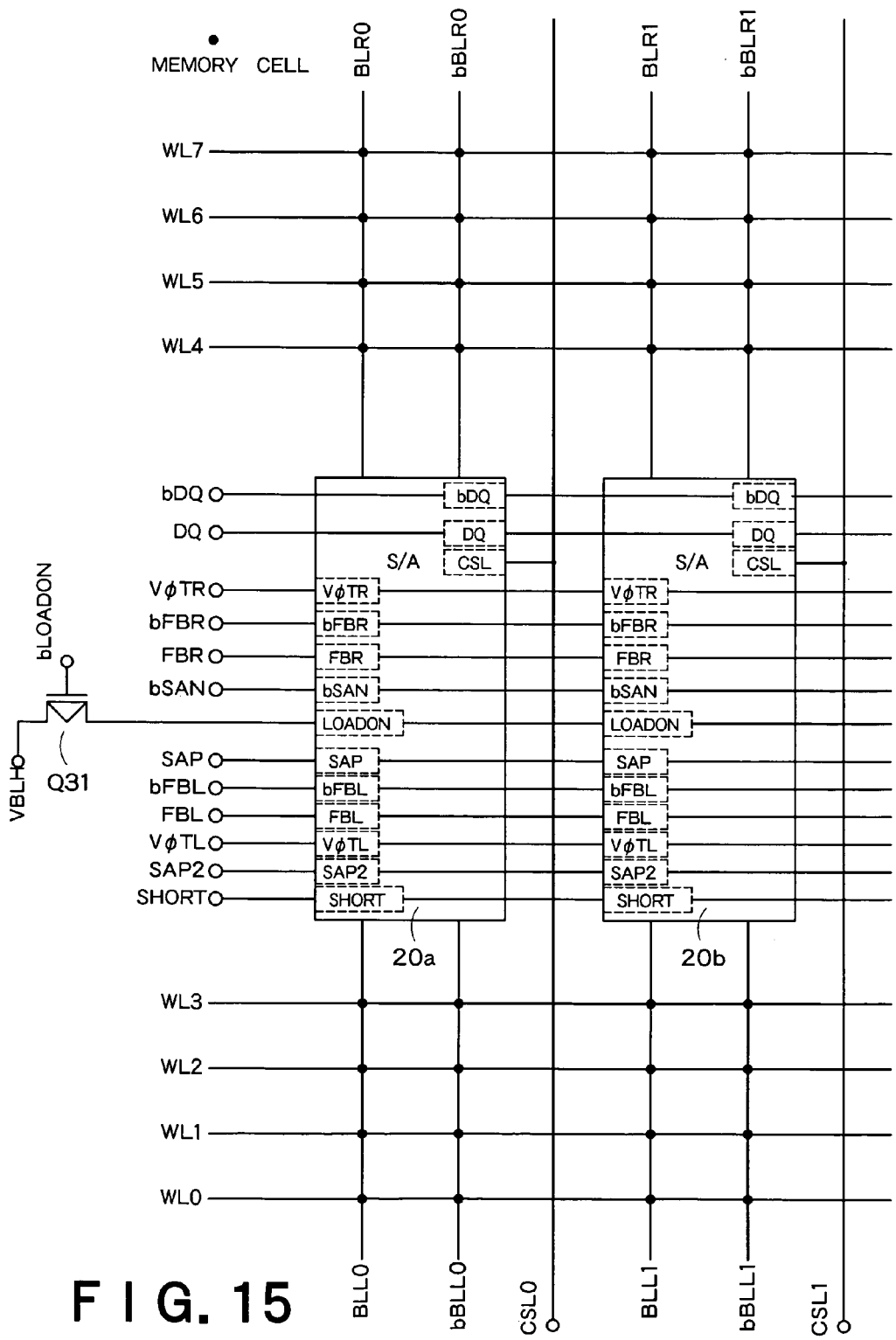
F I G. 15

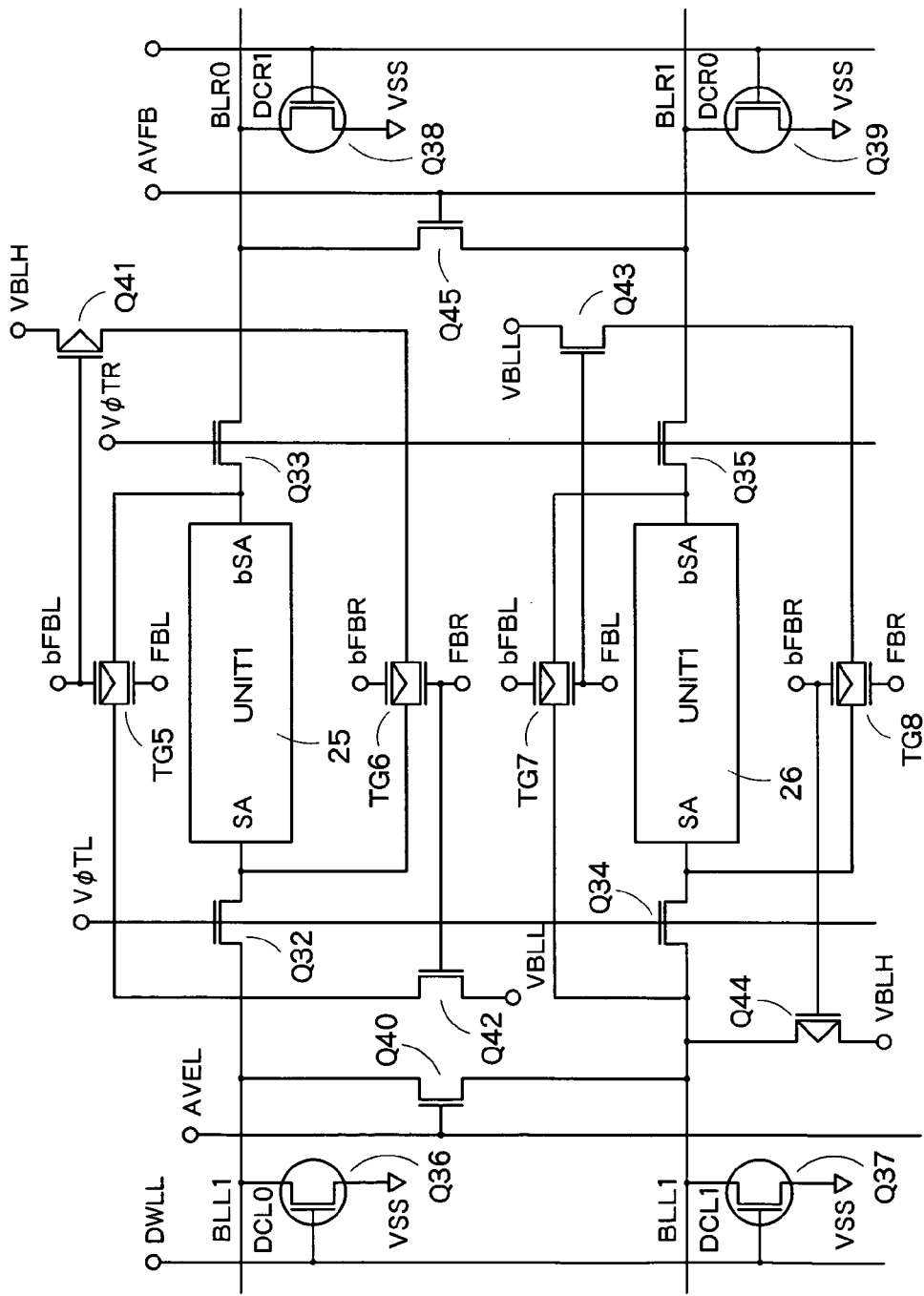
F I G. 16

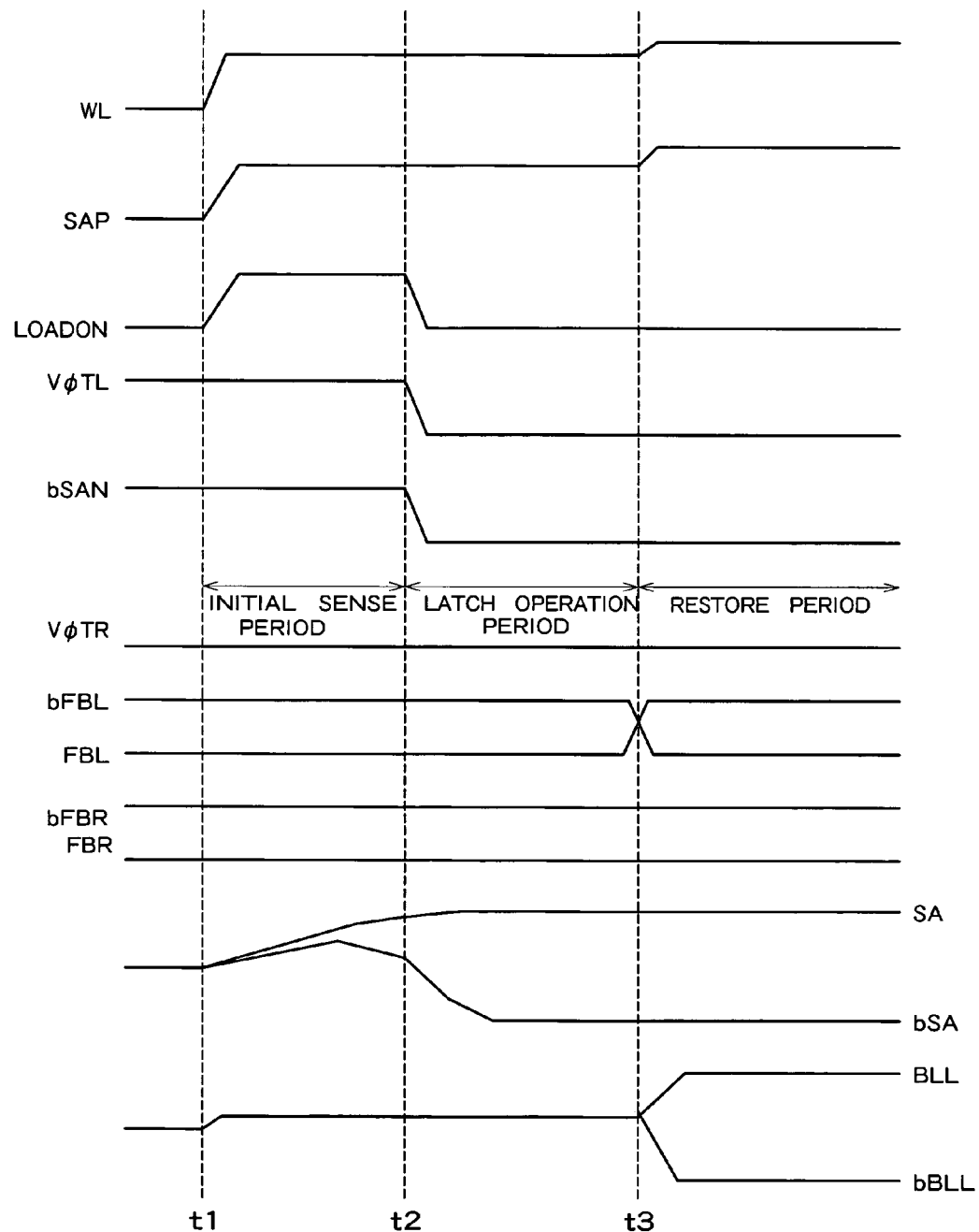
F I G. 18

SEMICONDUCTOR MEMORY DEVICE

CROSS REFERENCE TO RELATED APPLICATIONS

This application is based upon and claims the benefit of priority from the prior Japanese Patent Application No. 2005-162828, filed on Jun. 2, 2005, the entire contents of which are incorporated herein by reference.

BACKGROUND OF THE INVENTION

1. Field of the Invention

The present invention relates to a semiconductor memory device which senses data read out from a memory cell by a sense amplifier to output the data.

2. Related Art

There is a known memory cell called an FBC (Floating Body Cell) which accumulates electric charges to a floating body of a transistor formed on an SOI (Silicon On Insulator) substrate. When "1" is written into the FBC, an SOI transistor performs a pentode operation, and holes generated by impact ionization are accumulated into the floating body. When "0" is written into the FBC, holes accumulated into the floating gate is discharged by setting a PN diode formed between a body and a drain to be forward bias. Consequently, when "0" is written into the FBC, a potential of the floating body becomes low, and a threshold voltage of the SOI transistor becomes high.

When the potential on the bit line is raised so much during a reading period, the SOI transistor performs pentode operation, and data of the memory cell holding "0" may be destroyed. Accordingly, the sense amplifier for performing read-out operation detects a current difference between "0" cell and "1" cell at a state of holding a bit line voltage to be a certain low voltage, by setting a word line to be a constant potential.

The FBC discriminates "1" and "0" depending on whether the number of the holes accumulated into the floating body in the SOI transistor is large or small. Because the bloating body is connected to outside via a PN junction part of the SOI transistor, the holes flow into from outside of the memory cell through a leak current in a reverse direction and a GIDL current. Therefore, data "0" may change into data "1".

Furthermore, a charge pump phenomenon may occur to decrease holes. In the charge pump phenomenon, holes in the floating body are lost several pieces for each cycle of up/down of the word line voltage. Even in this case, data "1" may change into data "0".

Under the above circumstances, The FBC needs a refresh operation in which a cell data is read out and written back while data stored in the memory cell does not change. The refresh operation is performed by the sense amplifier.

When data is read out from the FBC, a slight potential difference read out from the FBC has to be correctly sensed. However, the circuit configuration of the conventional sense amplifier may sense "1" as "0", or "0" as "1" when performing high-speed operation (see T. Ohsawa et al., "An 18.5 ns 128 Mb SOI DRAM with a Floating Body Cell", ISSCC Dig. Tech. Papers, pp458-459, February 2005).

SUMMARY OF THE INVENTION

According to one embodiment of the present invention a semiconductor memory device, comprising:

first and second sense nodes which are provided corresponding to first and second bit lines; and a sense amplifier which is connected to the first and second sense nodes and senses data read out from a memory cell, wherein the sense amplifier includes:

an initial sense circuit which increases a potential difference between the first and second sense nodes in a first period after beginning sense operation; and a latch circuit which increases and holds the potential difference between the first and second sense nodes in a second period after the first period, wherein the initial sense circuit includes:

first and second transistors of first conductive type, of which both gates are connected to each other and which forms a current mirror circuit which flows current in proportion to each other to the first and second sense nodes;

third and fourth transistors of first conductive type, of which both gates are connected to each other and which forms a current mirror circuit which flows current in proportion to each other to the first and second sense nodes; and fifth and sixth transistors of first conductive type, of which both gates are connected to each other and which forms a current mirror circuit which controls operation of the first to fourth transistors, wherein the latch circuit includes:

seventh and eighth transistors of first conductive type which are connected in cascade between the first and second sense nodes, of which one gate is connected to the second sense node, and of which the other gate is connected to the first sense node; and ninth and tenth transistors of second conductive type which are connected in cascade between the first and second sense nodes, of which one gate is connected to the second sense node, and of which the other gate is connected to the first sense node.

According to one embodiment of the present invention a semiconductor memory device, comprising:

first and second sense nodes provided corresponding to first and second bit lines; and a sense amplifier which is connected to the first and second sense nodes and senses data read out from a memory cell, wherein the sense amplifier includes:

an initial sense circuit which increases a potential difference between the first and second sense nodes in a first period after beginning sense operation; and a latch circuit which latches a potential difference between the first and second sense nodes in a second period after the first period, wherein the initial sense circuit includes:

first and second transistors of first conductive type, which are connected in cascade between the first and second sense nodes, of which one gate is connected to the second sense node, and of which the other gate is connected to the first sense node; and third and fourth transistors of second conductive type, which are connected in cascade between the first and second sense nodes, of which one gate is connected to the second sense node, and of which the other gate is connected to the first sense node, wherein the latch circuit includes fifth and sixth transistors of second conductive type which are connected in cascade between the first and second sense nodes, of which one gate is connected to the second sense node, and of which the other gate is connected to the first sense node, the first and second transistors being shared by the initial sense circuit and the latch circuit.

BRIEF DESCRIPTION OF THE DRAWINGS

FIG. 1 is a circuit diagram of a sense amplifier in a semiconductor memory device according to a first embodiment of the present invention.

FIG. 11 is an operational timing diagram of the sense amplifier of FIG. 10.

FIG. 12 is a diagram showing operational performance of the initial sense circuit 21.

FIG. 13 is a circuit diagram of a sense amplifier in the semiconductor memory device according to the third embodiment of the present invention.

FIG. 14 is an operational timing diagram of the sense amplifier of FIG. 13.

FIG. 15 is a block diagram showing schematic configuration in the vicinity of the sense amplifier in the semiconductor memory device according to the fourth embodiment of the present invention.

FIG. 16 is a circuit diagram showing internal configuration of the sense amplifier.

FIG. 18 is a timing diagram showing a modified example of the second embodiment.

DETAILED DESCRIPTION OF THE INVENTION

Hereafter, embodiments according to the present invention will be described more specifically with reference to the drawings.

First Embodiment

Figure 2:
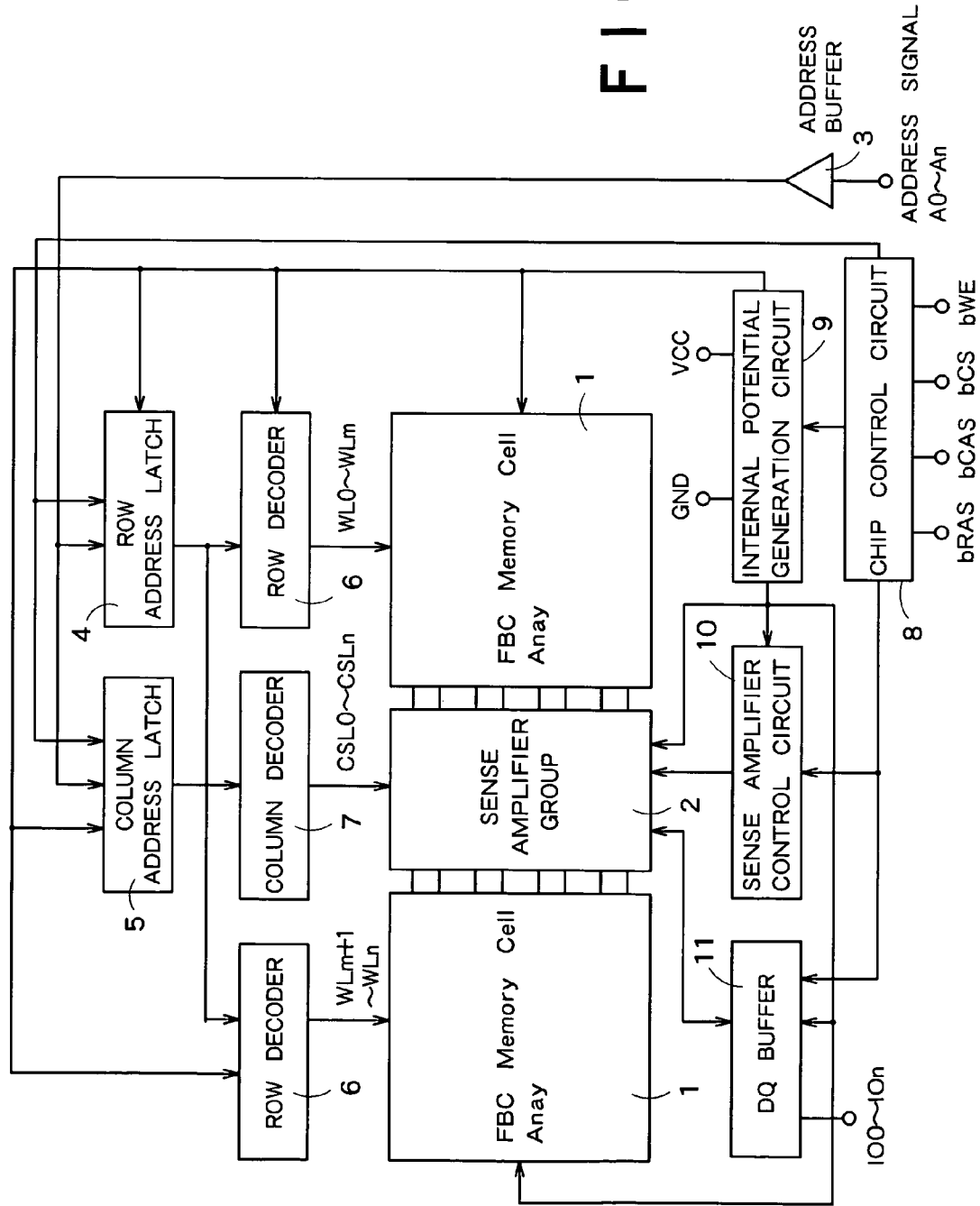
FIG. 2 is a block diagram showing schematic configuration of the semiconductor memory device.

FIG. 1 is a circuit diagram of a sense amplifier in a semiconductor memory device according to a first embodiment of the present invention. FIG. 2 is a block diagram showing schematic configuration of the semiconductor memory device. The semiconductor memory device shown in FIGS. 1 and 2 uses FBCs as memory cells.

First of all, schematic configuration of the semiconductor memory device according to the first embodiment will be described with reference to FIG. 2. The semiconductor memory device of FIG. 2 has memory cell arrays 1 composed of a plurality of FBCs, a sense amplifier group 2 composed of a plurality of sense amplifiers connected to the memory cell array 1, an address buffer 3 which buffers an address signal from outside, a row address latch 4 which latches a row address passing through the address buffer 3, a column address latch 5 which latches a column address passing through the address buffer 3, a row decoder 6 which sets a word line potential based on a latch signal of the row address latch 4, a column decoder 7 which sets a potential on a column selection line based on the latched signal of the column address latch 5, a chip control circuit 8 which generates various control signals, an internal potential generation circuit 9, a sense amplifier control circuit 10, and a DQ buffer 11 which outputs data sensed by the sense amplifier.

FIG. 1 shows a circuit configuration of one sense amplifier included in the sense amplifier group 2 of FIG. 2. The sense amplifier of FIG. 1 corresponds to 2 cell/1 bit scheme which constitutes one bit by two memory cells "A" and "B". It is assumed that "1" is defined when data is written to "A" so that the threshold voltage of the FBC cell lowers and data is written to "B" so that the threshold voltage of the FBC cell rises, and "0" is defined when data is written to "A" so that the threshold voltage of the FBC cell rises and data is written to "B" so that the threshold voltage of the FBC cell lowers. When the 2 cell/1 bit scheme is compared with 1 cell/1 bit scheme, the former has less advantage than the latter in memory volume per area as a matter of course. However, the amount of signal for effective read-out in the former is twice as that of the latter. Therefore, the former is effective in high-end products which require high-speed read-out.

The power supply voltage VBLH inputted to the sense amplifier of FIG. 1 corresponds to a bit line potential at "1" writing time. When the source potential of the cell transistor is 0V, the voltage VBLH is normally about 1.5V. The power supply voltage VBLL is a bit line potential at "0" writing time, and about (−1.5V) is assumed.

A bit line pair BLL and bBLL is arranged at left side of the sense amplifier of FIG. 1, and a bit line pair BLR and bBLR is arranged at right side of the sense amplifier of FIG. 2. The bit line pair BLL and bBLL is connected to the memory cell array 1 at left side of FIG. 2, and the bit line pair BLR and bBLR is connected to the memory cell array 1 at right side of FIG. 2. The sense amplifier senses data on either of the two bit line pairs depending on the logic of the word line.

The sense amplifier of FIG. 1 has a sense node pair SA and bSA, transistors Q1 and Q2 which switch whether to conduct the bit line pair BLL and bBLL and the sense node pair SA and bSA, transistors Q3 and Q4 which switch whether to conduct the bit line pair BLR and bBLR and the sense node pair SA and bSA, an initial sense circuit 21, transistors Q5, Q6 and Q7 constituting a latch circuit 22 which performs latch operation after the initial sense, transistors Q9 and Q10 which perform output control of data by a logic of a column selection signal CSL, transfer gates TG1, TG2, TG3 and TG4 which control write-back of data for refresh control, and a transistor Q11 which short-circuits the sense node pair SA and bSA at standby time.

The initial sense circuit 21 has PMOS transistors Q12 and Q13 which constitutes a current mirror circuit and of which both gates are connected to each other, PMOS transistors Q14 and Q15 which constitutes a current mirror circuit and of which both gates are connected to each other, PMOS transistors Q16 and Q17 which constitutes a current mirror circuit and of which both gates are connected to each other. The source of the PMOS transistor Q12 is set to a reference voltage VBLH, the drain of the PMOS transistor Q12 is connected to the drains of the PMOS transistors Q14 and Q16, and the sources of the PMOS transistors Q14 and Q16 are connected to the sense node SA. The source of the PMOS transistor Q13 is set to the reference voltage VBLH, the drain of the PMOS transistor Q13 is connected to the sources of the PMOS transistors Q15 and Q17, and the drains of the PMOS transistors Q15 and Q17 are connected to the sense node bSA.

The PMOS transistors Q5 and Q6 in the latch circuit 22 are connected in cascade between the sense nodes SA and bSA, the gate of the PMOS transistor Q5 is connected to the sense node bSA, and the gate of the PMOS transistor Q6 is connected to the sense node SA. The connection node between the PMOS transistors Q5 and Q6 is provided with the signal SAP.

The NMOS transistors Q7 and Q8 in the latch circuit 22 is connected in cascade between the sense nodes SA and bSA, the gate of the NMOS transistor Q7 is connected to the sense node bSA, and the gate of the NMOS transistor Q8 is connected to the sense node SA. The connection node between the NMOS transistors Q7 and Q8 is provided with the signal bLOADON. When the signal SAP is "1" and the signal bSAN is "0", the latch circuit 22 performs latch operation.

The transfer gate TG1 switches whether to connect the sense node SA and the bit line bBLL by a logic of the signals FBL and bFBL. The transfer gate TG2 switches whether to connect the sense node bSA and the bit line BLL by a logic of the signals FBL and bFBL. The transfer gate TG3 switches whether to connect the sense node SA and the bit line bBLR by a logic of the signals FBR and bFBR. The transfer gate TG4 switches whether to connect the sense node bSA and the bit line BLR by a logic of the signals FBR and bFBR.

The transistor Q11 switches whether to connect the sense nodes SA and bSA by a logic of the signal SHORT.

Figure 3:
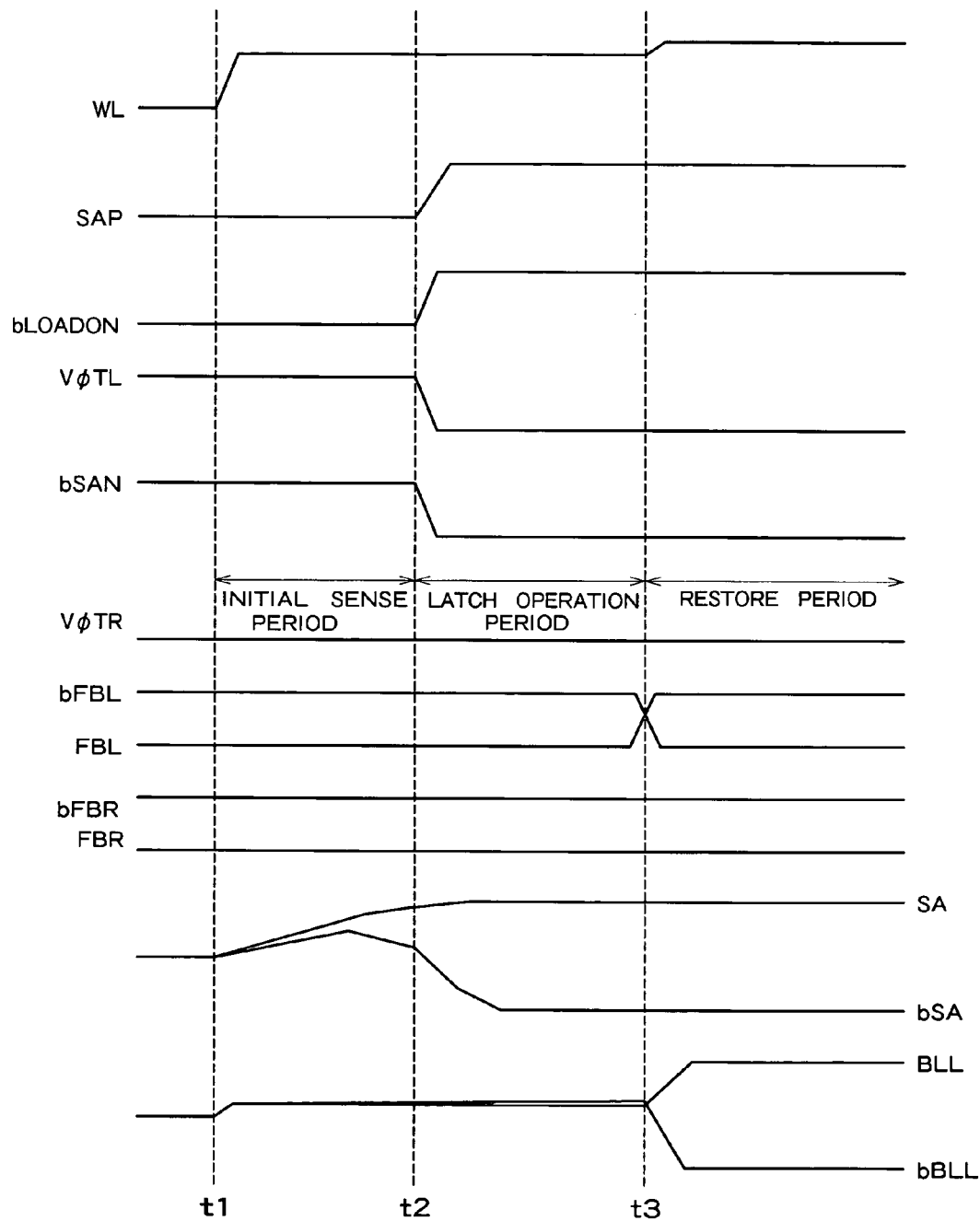
FIG. 3 is an operational timing diagram of the sense amplifier of FIG. 2.

FIG. 3 is an operational timing diagram of the sense amplifier of FIG. 2. Hereinafter, operation of the sense amplifier in FIG. 2 will be described with reference to FIG. 3. The "1" is read out from the bit line BLL, and the "0" is read out from the bit line bBLL.

A period of time t1 to t2 corresponds to an initial sense period. In this period, the transistors Q1 and Q2 turn on, and the bit line pair BLL and bBLL and the sense node pair SA and bSA become the same potential. In this period, because the signal bLOADON is "0", the PMOS transistors Q12 and Q13 turn on, and the initial sense circuit 21 begins operation. Because "1" cell is connected at bit line BLL side, the potential on the bit line BLL tries to rise higher than the potential on the bit line bBLL. Because of this, the current in proportion to the sense node pair SA and bSA flows through the transistors Q14 to Q17 in the initial sense circuit 21, and the potential difference between the sense node pair SA and bSA grows gradually.

At time t2, the PMOS transistors Q12 and Q13 turn off, and the transistors Q14 to Q17 do not flow the current to the sense node pair SA and bSA. At this time, the signal SAP is "1", the signal bSAN is "0", and the latch circuit 22 composed of the PMOS transistors Q5 to Q8 begins the latch operation based on the potential difference between the sense nodes SA and bSA.

At time t3, logics of the signals FBL and bFBL turn around, and data latched by the latch circuit 22 is restored in the bit line pair BLL and bBLL.

The present embodiment uses the FBCs as the memory cells. Electrical property in which fluctuation is the largest in an SOI cell formed on an SOI substrate such as the FBC is a threshold voltage of the SOI cell. Therefore, inventors of this application have performed operational simulation of the sense amplifier in FIG. 1 to conduct Monte Carlo analysis. In this simulation, electrical properties of the FBC have been fluctuated in conformity with an experimental value, a standard deviation and an average of the threshold voltage of transistors constituting the sense amplifier have been set to coincide with experimental values. Therefore, we consider that credibility of the simulation is high. In the simulation, fluctuation of symmetry property of the current mirror circuit in the sense amplifier has been also taken into consideration. The fluctuation of the electrical property has been given by the distribution based on the experimental value.

Figure 4:
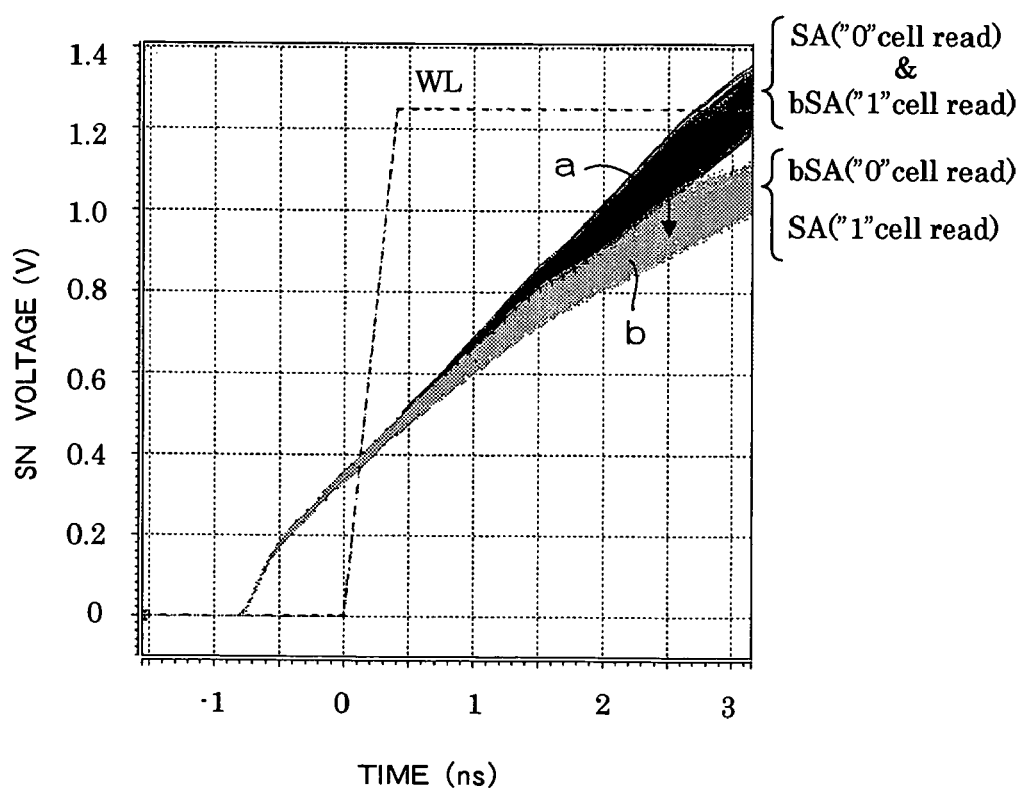
FIG. 4 is a diagram showing voltage variation of the sense nodes SA and bSA of FIG. 1.

FIG. 4 is a diagram showing voltage variation of the sense nodes SA and bSA of FIG. 1, and shows a result of simulation. A horizontal axis of FIG. 4 is time, and a vertical axis of FIG. 4 is the voltages on the sense nodes SA and bSA. In horizontal axis, a time when the word line rises is 0 ns, and a time when the signal bLOADON indicating the beginning of the latch operation becomes "1" is 1 ns.

The sense amplifier of FIG. 1 is symmetric in circuit configuration at the sense node SA side and the sense node bSA side. The voltage fluctuation at the sense node SA side is the same as that at the sense node bSA side. A waveform "a" of FIG. 4 shows a waveform at the sense node SA when "0" is read out at the sense node SA side and "1" is read out at the sense node bSA, or a waveform at the sense node bSA when "1" is read out at the sense node SA and "0" is read out at the sense node bSA. A waveform "b" shows a waveform at the sense node bSA when "0" is read out at the sense node SA side and "1" is read out at the sense node bSA side, or a waveform at the sense node SA when "1" is read out at the sense node bSA side and "0" is read out at the sense node SA side.

The sense amplifier of FIG. 1 senses the potential difference between the waveforms "a" and "b" of FIG. 4, and the same potential difference is sensed even when either of "1" or "0" is read out. Therefore, stable sense operation can be performed regardless of the logic of the read-out data.

Figure 5:
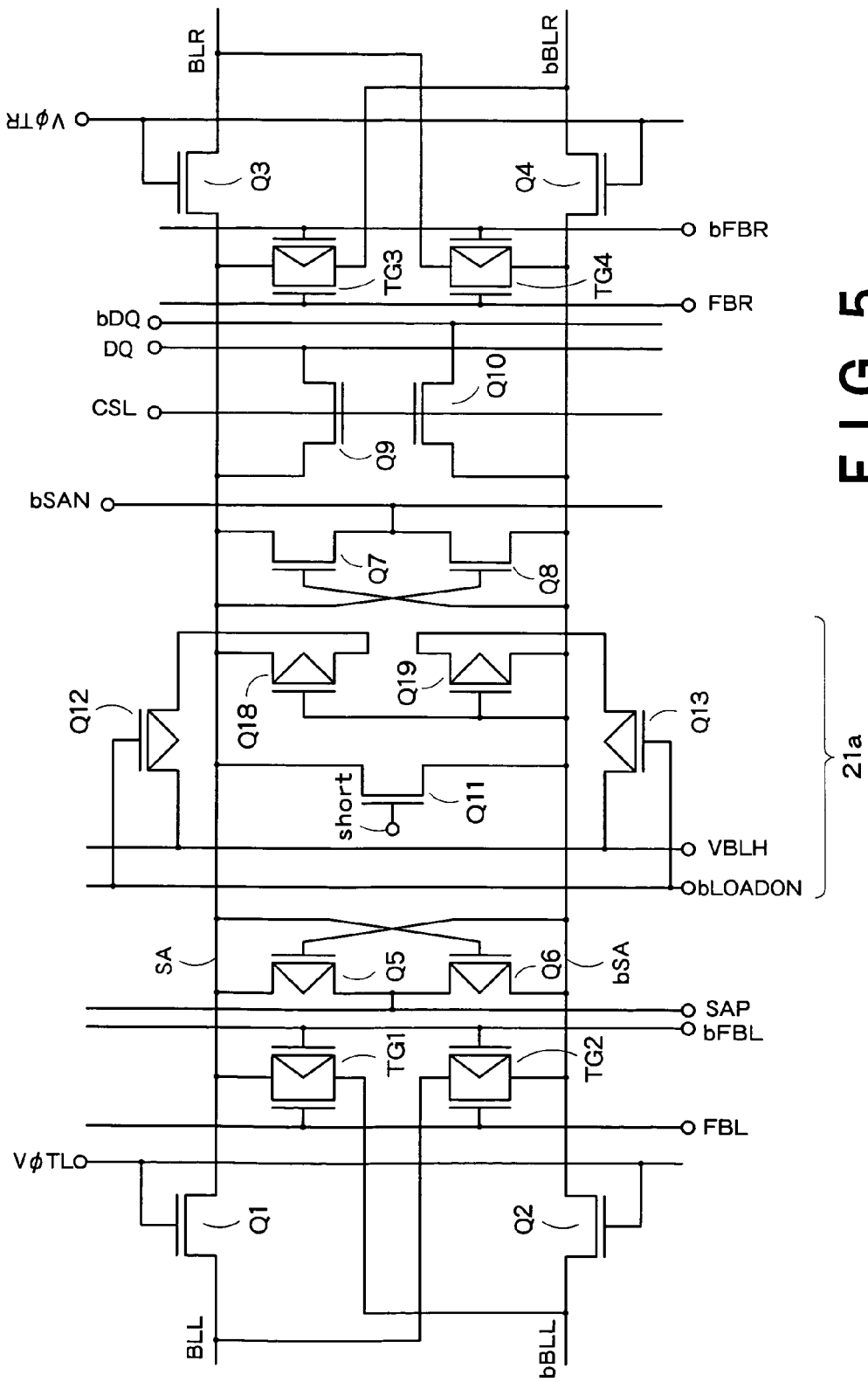
FIG. 5 is a circuit diagram showing one example of a sense amplifier in which circuit configuration at the sense node SA side is asymmetric to circuit configuration at the sense node bSA side.

On the other hand, FIG. 5 is a circuit diagram showing one example of a sense amplifier in which circuit configuration at the sense node SA side is asymmetric to circuit configuration at the sense node bSA side. The sense amplifier of FIG. 5 has an initial sense circuit having circuit configuration different from that of FIG. 1. The initial sense circuit 21a of FIG. 5 has PMOS transistors Q18 and Q19 constituting a current mirror circuit, and PMOS transistors Q12 and Q13 which control operations of the transistors Q18 and Q19. The gates of the PMOS transistors Q18 and Q19 are connected to the sense node bSA, the drain of the PMOS transistor Q18 is connected to the drain of the PMOS transistor Q12, and the drain of the PMOS transistor Q19 is connected to the drain of the PMOS transistor Q13. The gates of the PMOS transistors Q12 and Q13 are provided with the signal bLOADON.

The sense amplifier of FIG. 5 does not have the current mirror circuit connected to the sense node SA side symmetrically to the PMOS transistors Q18 and Q19. Therefore, the potential difference between the sense nodes SA and bSA is not prone to increase during the initial sense period. According to circumstances, "0" and "1" may be erroneously sensed.

Figure 6:
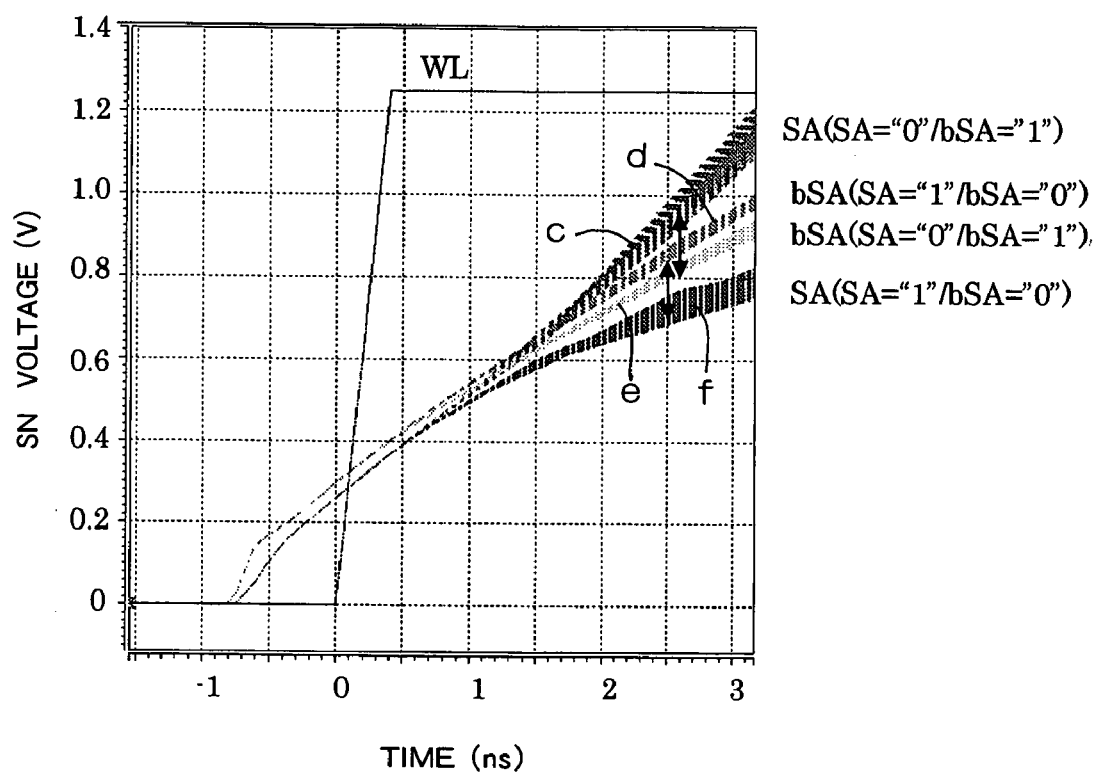
FIG. 6 is a diagram showing a voltage variation on the sense nodes SA and bSA of FIG. 5.

FIG. 6 is a diagram showing a voltage variation on the sense nodes SA and bSA of FIG. 5, and shows a simulation result. A waveform "c" of FIG. 6 shows a waveform of the sense node SA when "0" is read out at the sense node SA side. A waveform "d" shows a waveform of the sense node bSA when "0" is read out at the sense node bSA side. A waveform "e" shows a waveform at the sense node bSA when "1" is read out at the sense node bSA side. A waveform "f" shows a waveform at the sense node SA when "1" is read out at the sense node SA side.

Because the sense amplifier senses the potential difference between the sense nodes SA and bSA, it detects the voltage between the waveform "c" and "e", or the voltage between the waveform "d" and "f". As obvious from FIG. 6, in the sense amplifier of FIG. 5, the voltage fluctuation at the sense node bSA side is smaller than that at the sense node SA side, and it is impossible to perform stable sense operation.

Figure 7:
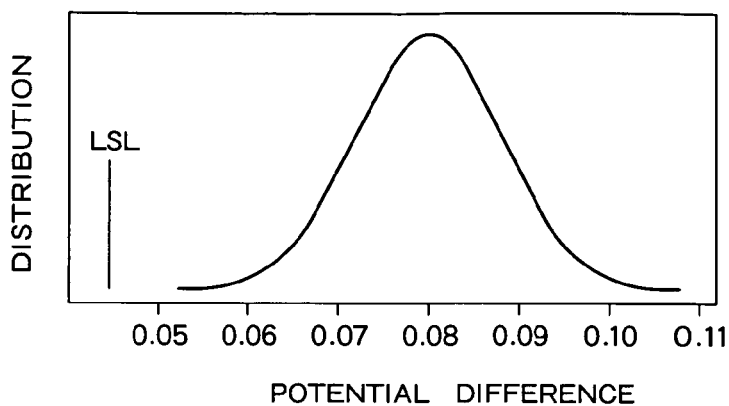
FIG. 7 is a diagram showing sense margin distribution of the sense amplifier of FIG. 1 when the above-mentioned Monte Carlo analysis has been experimentally performed 1000 times.
Figure 8:
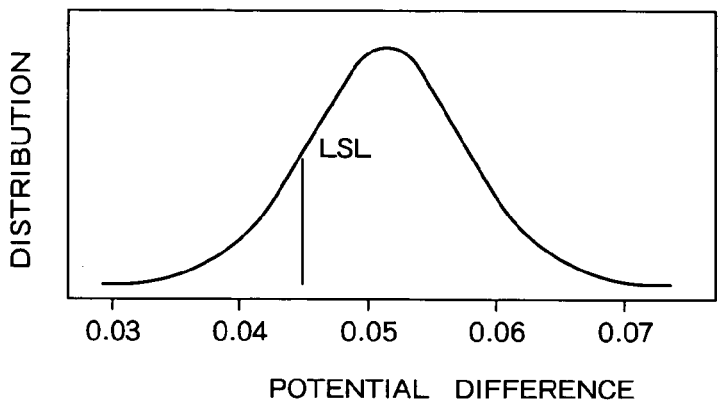
FIG. 8 and FIG. 9 are diagrams showing sense margin distribution of the sense amplifier of FIG. 5 when the same Monte Carlo analysis has been experimentally performed 1000 times.
Figure 9:
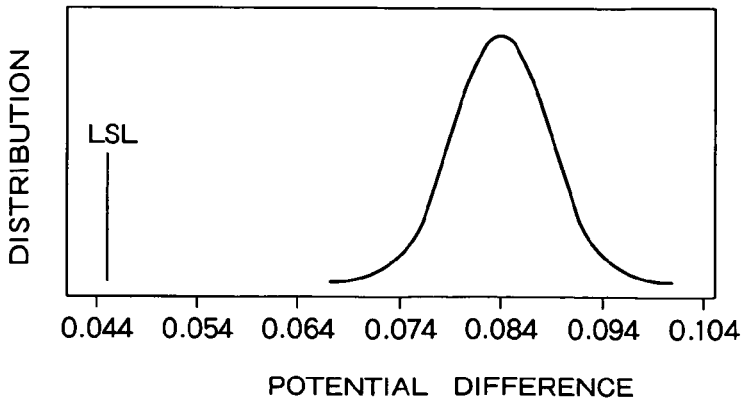

FIG. 7 is a diagram showing sense margin distribution of the sense amplifier of FIG. 1 when the above-mentioned Monte Carlo analysis has been experimentally performed 1000 times. FIG. 8 and FIG. 9 are diagrams showing sense margin distribution of the sense amplifier of FIG. 5 when the same Monte Carlo analysis has been experimentally performed 1000 times. FIG. 8 is a diagram showing sense margin distribution when "0" is read out at the sense node SA, and "1" is read out at the sense node bSA. FIG. 9 is a diagram showing sense margin distribution when "1" is read out at the sense node bSA and "0" is read out at the sense node SA.

The horizontal axes of FIGS. 7-9 denote the potential difference between the sense nodes SA and bSA, and the vertical axes denote the number of distribution. The "LSL" shown in FIGS. 7-9 denotes a reference potential difference to perform the latch operation. As apparent from FIG. 7, in the case of the sense amplifier of FIG. 1, plots are distributed at more right side than the "LSL", and erroneous data may not be latched. On the other hand, in the case of the sense amplifier of FIG. 5, as apparent from FIG. 8, about 30% in the whole plots is distributed at more left side than the "LSL". Therefore, erroneous data may be latched.

As described above, in the case of the sense amplifier of FIG. 1, circuit configuration at the sense node SA side is symmetric to circuit configuration at the sense node bSA. Therefore, tendency of potential variation at the sense node SA coincides with tendency of potential variation at the sense node bSA. Even when data of any logic is read out, it is possible to perform correct sense operation.

Second Embodiment

Circuit configuration of the sense amplifier of FIG. 1 is more complicated than that of the sense amplifier of FIG. 5. Therefore, the number of circuit elements and implementation area may increase. A second embodiment described hereinafter simplifies circuit configuration and reduces the number of circuit elements and implementation area while maintaining various performance at initial sense time.

Figure 10:
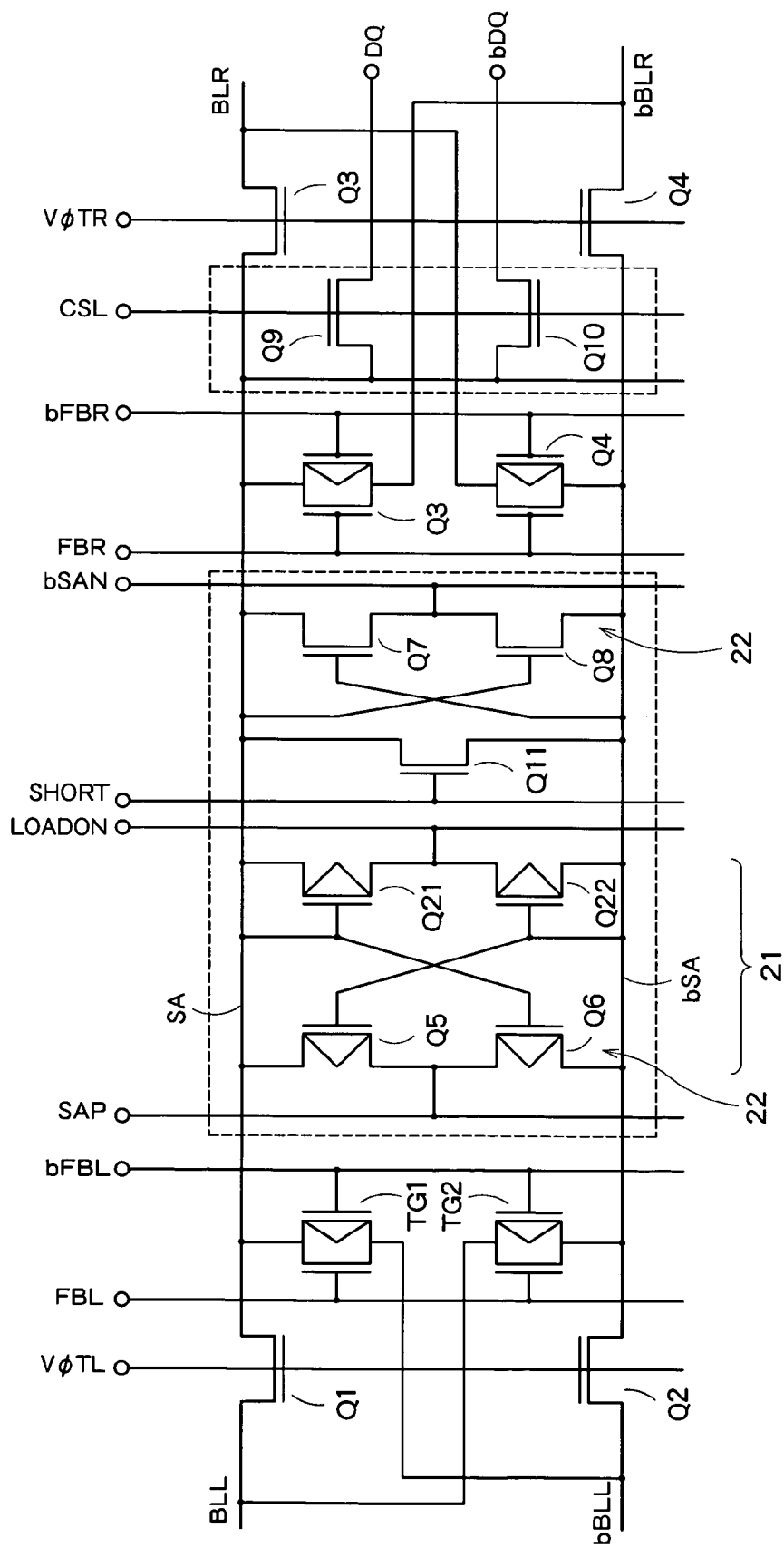
FIG. 10 is a circuit diagram of the sense amplifier in the semiconductor memory device according to the second embodiment of the present invention.
Figure 17:
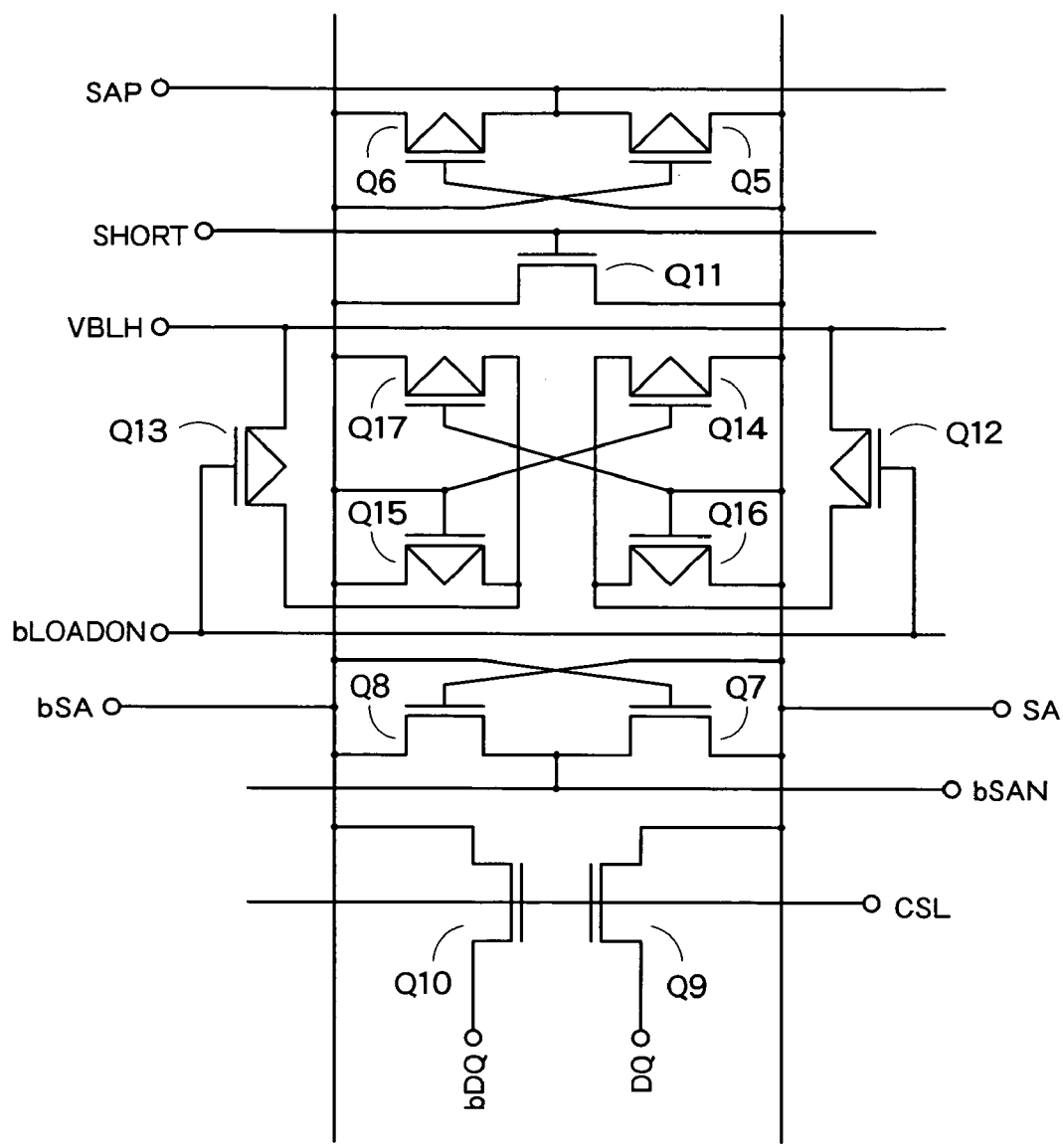
FIG. 17 is a circuit diagram showing circuit configuration in the case of using the sense core part having the same configuration as that of FIG. 1.

FIG. 10 is a circuit diagram of the sense amplifier in the semiconductor memory device according to the second embodiment of the present invention. In FIG. 10, the same reference numerals are attached to constituents common to that of FIG. 1, and hereinafter, difference will be mainly described.

The sense amplifier of FIG. 10 uses the transistors Q5 and Q6 among the transistors Q5 to Q8 constituting the latch circuit 22 in the sense amplifier of FIG. 1 as transistors for the initial sense circuit 21. The initial sense circuit 21 has the PMOS transistors Q5 and Q6 connected in cascade between the sense nodes SA and bSA and the PMOS transistors Q21 and Q22 connected in cascade between the sense nodes SA and bSA. The connection node of the PMOS transistors Q5 and Q6 is provided with the signal SAP. The connection node of the PMOS transistors Q21 and Q22 is provided with the signal LOADON. The gate of the PMOS transistor Q5 and the gate of the PMOS transistor Q22 are connected to each other to constitute a current mirror circuit. The gate and the source of the PMOS transistor Q21 are short-circuited. The gate of the PMOS transistor Q6 and the gate of the PMOS transistor Q21 are connected to each other to constitute a current mirror circuit. The gate and the source of the PMOS transistor Q22 are short-circuited.

In the PMOS transistors Q5 and Q6 in the initial sense circuit 21, it is required that channel lengths L which decides static property of transistor are equal to each other, and channel widths W are also equal to each other. Similarly, in the PMOS transistors Q21 and Q22, it is required that channel lengths L are equal to each other and channel widths W are also equal to each other.

The PMOS transistors Q5 and Q22 constitute a current mirror circuit, and the PMOS transistors Q6 and Q21 also constitute a current mirror circuit. When a ratio W1/L1 of the channel width W1 to the channel lengths L1 of the PMOS transistors Q5 and Q6 is assumed as P1, and a ratio W2/L2 of the PMOS transistors Q21 and Q22 is assumed as P2, a ratio $Id\_A/Id\_D$ of the current $Id\_A$ flowing through the PMOS transistor Q5 and the current $Id\_D$ flowing through the PMOS transistor Q22 satisfies a relationship of $Id\_A/Id\_D=P1/P2$ as long as the PMOS transistors Q5 and Q6 operate at pentode region.

FIG. 11 is an operational timing diagram of the sense amplifier of FIG. 10. FIG. 11 shows an example of reading out data of "1" from the bit line BLL and data of "0" from the bit line bBLL. Hereinafter, the operation of the sense amplifier of FIG. 10 will be described with reference to FIG. 11.

When the word line goes up at time t1, a certain cell data is provided to the bit lines BLL and bBLL. At this time, because the signal VφTL is "1", the transistors Q1 and Q2 turn on, and the sense nodes become the same potential as that on the bit lines BLL and bBLL.

Since the signal LOADON is "1" and the signal SAP is "1" during time t1 to t2, the PMOS transistors Q5, Q6, Q21 and Q22 in the initial sense circuit 21 flow the current in proportion to the sense nodes SA and bSA. Therefore, after time t1, the potential difference between the sense nodes SA and bSA increases gradually.

At time t2, the signal LOADON becomes "0", and the PMOS transistors Q21 and Q22 turn off. At this time, the signal bSAN also becomes "0", and the NMOS transistors Q7 and Q8 operate as the latch circuit 22 of cross-coupled type with the PMOS transistors Q5 and Q6. Therefore, the potential difference between the sense nodes SA and bSA gradually increased during the initial sense period is further increased.

The voltage of the signal SAP during time t2 to t3 is VBLH, and the voltage of the signal bSAN is VBLL, the sense node (for example, SA) at side connected with "0" cell approach VBLH, and the sense node (for example, bSA) at side connected with "1" cell approach VBLL.

At time t3, the latch operation period ends, and the restore period starts. During the restore period, the signal FBL becomes "1", and the signal bFBL becomes "0". It is assumed that the cell connected to the bit line pair BLL and bBLL is read out. Therefore, the transfer gates TG1 and TG2 turn on, and data latched by the sense amplifier is restored in the SOI cell.

The PMOS transistors Q5 and Q6 of FIG. 10 are used for the load during the initial sense period and the bit line drive for writing during the restore period. It is preferable that the ratio W/L of the channel width W to the channel length L of the PMOS transistors Q5 and Q6 is larger in that the bit line potential at "1" writing time is maintained to be sufficiently high potential and "1" is written at high speed.

On the other hand, in terms of the load during the initial sense period, the ratio W/L of the PMOS transistors Q5 and Q6 cannot set too much. It is preferable to set the ratio W/L in which the same amount of current as the current of the cell transistor at reading-out time flows.

According to a detailed simulation result, to enlarge the potential difference at the sense nodes SA and bSA so that erroneous sense does not occur at the initial sense time, when the ratio W/L of the PMOS transistors Q5 and Q6 is P1, and the ratio W/L of the PMOS transistors Q21 and Q22 is P2, P1>P2 is preferable at a range that the current flowing through the PMOS transistors Q5 and Q21 does not increase so much, as compared with the current flowing when the memory cell transistor reads out data.

FIG. 12 is a diagram showing operational performance of the initial sense circuit 21. A horizontal axis of FIG. 12 denotes a current mirror ratio (a ratio of the channel width W of the transistors Q21 and Q22 and the channel width of the transistors Q5 and Q6), and a vertical axis is a time period from a rising time of the signal LOADON until when the potential difference between the sense nodes SA and bSA becomes a value capable of being latched (for example, 0.045V). A curb "A" of FIG. 12 shows a characteristic curve in the case of fixing the channel length L and the channel width W of the transistors Q21 and Q22, and a curb "B" shows a characteristic curb in the case of fixing the channel length L and the channel width W of the transistors Q5 and Q6.

FIG. 12 has been calculated by circuit simulation on the condition that element fluctuation assumed by each transistor is the worst case.

As apparent from the curbs "A" and "B" of FIG. 12, there is a tendency that the initial sense period becomes short when the transistors Q5 and Q6 are a little bit larger than the transistors Q21 and Q22.

The simulation result is established even in the transistors Q14 to Q17 according to the first embodiment in the same way.

In this way, if the ratio W/L of the transistors Q5, Q6, Q21 and Q22 to satisfy P1>P2 exists, that is, if the Ratio W/L in which the initial sense period is short and it is possible to easily write "1" at the restore time exists, it is the best. However, when such a ratio W/L does not exist, a hereinafter described third embodiment is preferable.

As described above, according to the second embodiment, partial transistors Q5 and Q6 in the initial sense circuit 21 are used even as the transistors for the latch circuit 22. Therefore, it is possible to largely simplify circuit configuration, compared with the first embodiment, thereby downsizing circuit volume and reducing power consumption.

The ratio W/L of the channel width W to the channel length L of the transistors Q5, Q6, Q21 and Q22 in the initial sense circuit 21 is optimized, thereby shortening the initial sense period.

Third Embodiment

A third embodiment is a modified example of the second embodiment, and increases drive capability of the sense amplifier when "1" is written back at restore time.

FIG. 13 is a circuit diagram of a sense amplifier in the semiconductor memory device according to the third embodiment of the present invention. The sense amplifier of FIG. 13 has PMOS transistors Q23 and Q24 connected in cascade between the sense nodes SA and bSA in addition to configuration of the sense amplifier of FIG. 10. The gate of the PMOS transistor Q23 is connected to the gate of the PMOS transistor Q5, and the gate of the PMOS transistor Q24 is connected to the gate of the PMOS transistor Q6. The connection node between the PMOS transistors Q23 and Q24 is provided with the signal SAP2. When the signal SAP2 is "1", the PMOS transistors Q23 and Q24 function to increase the potential difference between the sense nodes SA and bSA with the transistors Q5 to Q8. In this way, the PMOS transistors Q23 and Q24 are used as a portion of the latch circuit 22.

FIG. 14 is an operational timing diagram of the sense amplifier of FIG. 13. In FIG. 14, a waveform of the signal SAP2 is added to FIG. 11. The signal SAP2 becomes "1" at time t2 when the latch period begins after the initial sense period. During the latch period (time t2 to t3), a latch circuit 22 of cross coupled type is constituted with the PMOS transistors Q5 to Q8, Q23 and Q24. By newly providing the PMOS transistors Q23 and Q24, the driving force of the sense amplifier can be increased during the latch operation period and "1" writing period for restore.

As described above, according to third embodiment, circuit volume increases by two transistors, compared with the second embodiment. However, by adding the PMOS transistors Q23 and Q24 to the latch circuit 22 for latching the sense nodes SA and bSA, it is possible to perform the restore operation at sufficiently high speed, while maintaining the ratio W/L of the PMOS transistors Q5, Q6, Q21 and Q22 for speeding up the initial sense.

Fourth Embodiment

In the above first to third embodiments, the sense amplifier corresponding to 2 cell/bit constituting one bit by two memory cells has been described. The present invention is applicable to the sense amplifier corresponding to 1 cell/bit constituting one bit by one memory cell.

FIG. 15 is a block diagram showing schematic configuration in the vicinity of the sense amplifier in the semiconductor memory device according to the fourth embodiment of the present invention. FIG. 16 is a circuit diagram showing internal configuration of the sense amplifier. The semiconductor memory device of FIG. 15 has sense amplifiers 20a and 20b corresponding to the respective bit line pairs. The bit line pairs are arranged at both sides of the respective sense amplifiers. A PMOS transistor Q31 is connected to a terminal of the signal LOADON of the sense amplifiers 20a and 20b, and the gate of the PMOS transistor Q31 is provided with the signal bLOADON. The signal bLOADON is turned around by the PMOS transistor Q31. Therefore, circuit area can be reduced more than the circuit of turning around the signal bLOADON by providing an inverter.

The sense amplifiers 20a and 20b have a sense core part shown in a dotted line in FIG. 1, 10 or 13. For example, circuit configuration in the case of using the sense core part having the same configuration as that of FIG. 1 is shown in FIG. 1.

FIG. 16 shows two sense core parts 25 and 26 for two bits. NMOS transistors Q32 and Q33 are connected between the sense nodes SA and bSA of the sense core part 25 and the bit line pair BLL0 and BLR0, and NMOS transistors Q34 and Q35 are connected between the sense nodes SA and bSA of the sense core part 26 and the bit line pair BLL1 and BLR1. The bit lines can be also used as dummy bit lines. Therefore, dummy cell transistors Q36 to Q39 are connected to the bit lines. Besides, the sense amplifier of FIG. 16 has an NMOS transistor Q40 which short-circuits the bit lines BLL0 and BLL1, an NMOS transistor Q41 which short-circuits the bit lines BLR0 and BLR1, and transistors Q41 to Q44 and transfer gates TG5 to TG8 for restore control.

Operational timing of the sense amplifier of FIG. 16 is basically the same as that of FIG. 11. Hereinafter, operation of the sense amplifier of FIG. 16 will be described with reference to FIG. 11.

First of all, the dummy cell transistor Q38 in which "1" is written is connected to the bit line BLR0, and the dummy cell transistor Q39 in which "0" is written is connected to the bit line BLR1. Time t1 to t2 corresponds to the initial sense period. In the period, a certain word line on which a read-out target cell connected to the bit lines BLL0 and BLL1 is connected, and a dummy word line corresponding to the certain word line are activated, and the signal AVER becomes "1". Therefore, the bit line BLR0 on which "1" cell is connected and the bit line BLR1 on which "0" dummy cell is connected are short-circuited to generate a refresh current as an intermediate current between the "1" cell and "0" cell. The other operation (time t1 to t3) from the initial sense period to the latch operation period is the same as the first embodiment.

At restore time, the transistors Q38 and Q39 are activated so that "1" is always written to "1" dummy cell and "0" is always written to "0" dummy cell. The latched data is restored to the read-out target cell, by setting the signal VφTL="0", the signal VφTR="0", the signal FBR="1", the signal bFBR="0", and the transfer gates TG6 and TG8 are turned on for restore.

As described above, even when the sense amplifier of 1 cell/bit is used, the sense amplifier having the same circuit configuration as that of the sense amplifier according to the first to third embodiments can be used. Therefore, stable latch operation can be performed, thereby performing speedy restore processing.

OTHER EMBODIMENT

As described in the above embodiment, in the circuit configuration in which the ratio W/L of the channel width W to the channel length L of the transistors Q5, Q6, Q21 and Q22 in the initial sense circuit 21 is optimized, "1" writing at restore time may be insufficient. As one solution of overcoming such a problem, the third embodiment has been proposed. As the other solution, without substantially changing the circuit configuration of the second embodiment, as shown in an operational timing of FIG. 18, a voltage of the signal SAP may be temporarily set to a voltage higher than the voltage VBLH during the latch period, i.e. after time t3.

Figure 19:
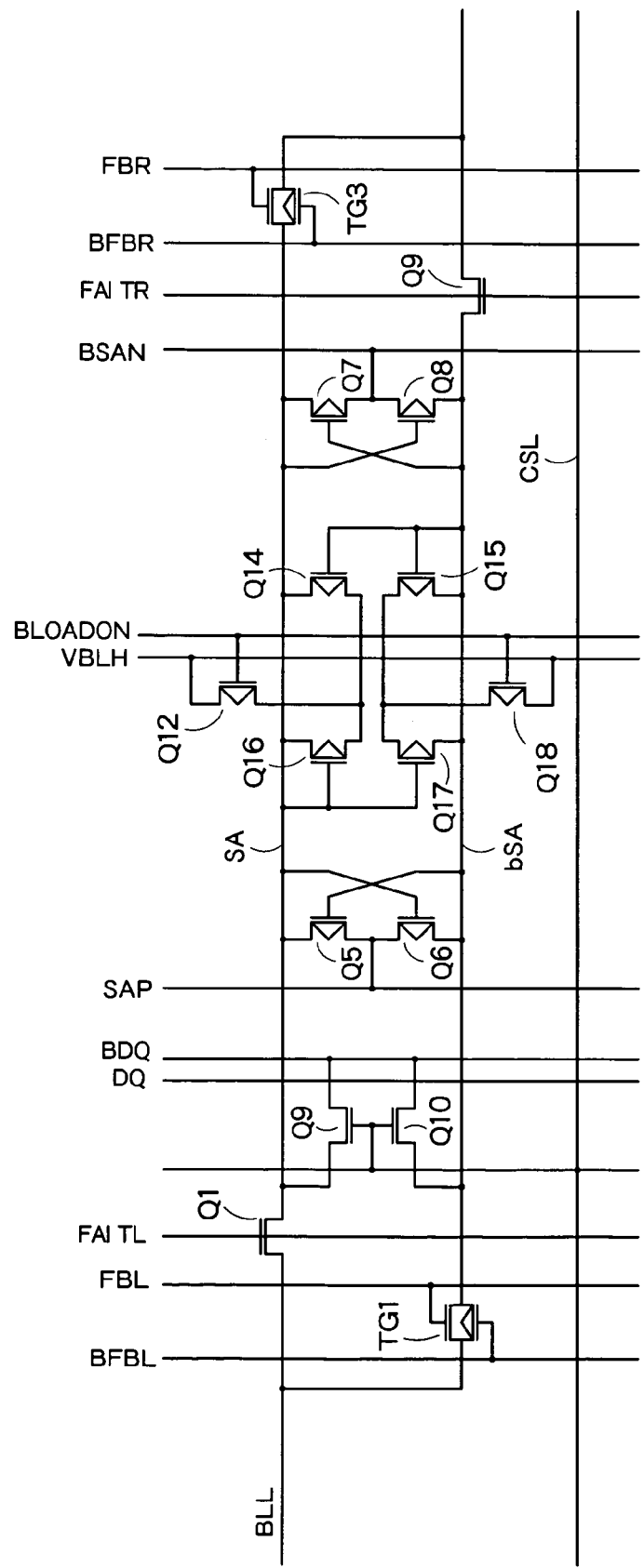
FIG. 19 is a circuit diagram showing one example of a sense amplifier of open type.

Although the sense amplifier of folded type has been described in the first to third embodiments, the present invention is applicable even to a sense amplifier of open type. The sense amplifiers shown in FIGS. 1, 10 and 13 may be open type. For example, FIG. 19 shows an example of replacing the sense amplifier of FIG. 1 with the sense amplifier of open type. In this way, the present invention is also applicable to the configuration of FIG. 19. Therefore, the present invention is applicable to various applications having various array configurations.

What is claimed is:

1. A semiconductor memory device, comprising:
first and second sense nodes which are provided corresponding to first and second bit lines; and
a sense amplifier which is connected to the first and second sense nodes and senses data read out from a memory cell,
wherein the sense amplifier includes:
an initial sense circuit which increases a potential difference between the first and second sense nodes in a first period after beginning sense operation; and
a latch circuit which increases and holds the potential difference between the first and second sense nodes in a second period after the first period,
wherein the initial sense circuit includes:
first and second transistors of first conductive type, of which both gates are connected to each other and which forms a current mirror circuit which flows current in proportion to each other to the first and second sense nodes;
third and fourth transistors of first conductive type, of which both gates are connected to each other and which forms a current mirror circuit which flows current in proportion to each other to the first and second sense nodes; and
fifth and sixth transistors of first conductive type, of which both gates are connected to each other and which forms a current mirror circuit which controls operation of the first to fourth transistors,
wherein the latch circuit includes:
seventh and eighth transistors of first conductive type which are connected in cascade between the first and second sense nodes, of which one gate is connected to the second sense node, and of which the other gate is connected to the first sense node; and
ninth and tenth transistors of second conductive type which are connected in cascade between the first and second sense nodes, of which one gate is connected to the second sense node, and of which the other gate is connected to the first sense node.

2. The semiconductor memory device according to claim 1,
wherein the initial sense circuit turns on the fifth and sixth transistors at a first time to flow current in accordance with the potential difference between the first and second sense nodes through the first to fourth transistors, and turns off the fifth and sixth transistors at a second time when the potential difference between the first and second sense nodes is equal to or more than a predetermined value; and
the latch circuit turns on the seventh and eighth transistors, or the ninth and tenth transistors at the second time or after the second time.

3. The semiconductor memory device according to claim 2, further comprising a transfer control circuit which supplies voltages at the first and second sense nodes held by the latch circuit to the first and second bit lines.

4. The semiconductor memory device according to claim 1,
wherein when a channel length and a channel width of the first and second transistors are L1 and W1, respectively, and a channel length and a channel width of the third and fourth transistors are L2 and W2, respectively, W1/L1>W2/L2 is established.

5. The semiconductor memory device according to claim 1, further comprising:
a cell array composed of a plurality of memory cells connected to a pair of first and second bit lines;
a first bit line switching circuit which controls connection or cut-off between the first bit line and the first sense node; and
a second bit line switching circuit which controls connection or cut-off between the second bit line and the second sense node,
wherein the memory cell is a transistor of second conductive type which stores "1" and "0" in accordance with the amount of carrier accumulated in a floating body.

6. The semiconductor memory device according to claim 1, further comprising:
third and fourth bit lines which are arranged adjacent to the first and second bit lines;
third and fourth sense nodes provided corresponding to the third and fourth bit lines;
first and second dummy cells which are connected to the first and second bit lines and store values different from each other;
third and fourth dummy cells which are connected to the third and fourth bit lines and store values different from each other;
a first short-circuit control transistor which controls whether to short-circuit the first and third bit lines;
a second short-circuit control transistor which controls whether to short-circuit the second and fourth bit lines; and
a separate sense amplifier which is connected to the third and fourth sense nodes, and which has the same configuration as that of the sense amplifier,
the first and third dummy cells storing values different from each other, and the second and fourth dummy cells storing values different from each other.

7. The semiconductor memory device according to claim 1, further comprising a folded type configuration in which a pair of the first and second sense nodes and a pair of the first and second bit lines are arranged at both sides of the sense amplifier.

8. The semiconductor memory device according to claim 1, further comprising an open type configuration in which the first and second sense nodes and the first and second bit lines are arranged only to one side of the sense amplifier.

9. The semiconductor memory device according to claim 1, further comprising an FBC connected to the first and second bit lines.

10. A semiconductor memory device, comprising:
first and second sense nodes provided corresponding to first and second bit lines; and
a sense amplifier which is connected to the first and second sense nodes and senses data read out from a memory cell,
wherein the sense amplifier includes:
an initial sense circuit which increases a potential difference between the first and second sense nodes in a first period after beginning sense operation; and
a latch circuit which latches a potential difference between the first and second sense nodes in a second period after the first period,
wherein the initial sense circuit includes:
first and second transistors of first conductive type, which are connected in cascade between the first and second sense nodes, of which one gate is connected to the second sense node, and of which the other gate is connected to the first sense node; and
third and fourth transistors of second conductive type, which are connected in cascade between the first and second sense nodes, of which one gate is connected to the second sense node, and of which the other gate is connected to the first sense node,
wherein the latch circuit includes fifth and sixth transistors of second conductive type which are connected in cascade between the first and second sense nodes, of which one gate is connected to the second sense node, and of which the other gate is connected to the first sense node,
the first and second transistors being shared by the initial sense circuit and the latch circuit.

11. The semiconductor memory device according to claim 10,
wherein a channel length and a channel width of the first transistor are the same as those of the second transistor, and a channel length and a channel width of the third transistor are the same as those of the fourth transistor.

12. The semiconductor memory device according to claim 10,
wherein when a channel length and a channel width of the first and second transistors are L1 and W1, respectively, and a channel length and a channel width of the third and fourth transistors are L2 and W2, respectively, W1/L1>W2/L2 is established.

13. The semiconductor memory device according to claim 10, further comprising:
seventh and eighth transistors of second conductive type which are connected in cascade between the first and second sense nodes and constitutes a portion of the latch circuit, of which one gate is connected to the gate of the first transistor, and of which the other gate is connected to the gate of the second transistor.

14. The semiconductor memory device according to claim 10, further comprising:
a cell array composed of a plurality of memory cells connected to a pair of first and second bit lines;
a first bit line switching circuit which controls connection or cut-off between the first bit line and the first sense node; and
a second bit line switching circuit which controls connection or cut-off between the second bit line and the second sense node,
wherein the memory cell is a transistor of second conductive type which stores "1" and "0" in accordance with the amount of carrier accumulated in a floating body.

15. The semiconductor memory device according to claim 10, further comprising:
third and fourth bit lines which are arranged adjacent to the first and second bit lines;
third and fourth sense nodes provided corresponding to the third and fourth bit lines;
first and second dummy cells which are connected to the first and second bit lines and store values different from each other;

third and fourth dummy cells which are connected to the third and fourth bit lines and store values different from each other;
a first short-circuit control transistor which controls whether to short-circuit the first and third bit lines;
a second short-circuit control transistor which controls whether to short-circuit the second and fourth bit lines; and
a separate sense amplifier which is connected to the third and fourth sense nodes, and which has the same configuration as that of the sense amplifier,
the first and third dummy cells storing values different from each other, and the second and fourth dummy cells storing values different from each other.

16. The semiconductor memory device according to claim 10, further comprising a folded type configuration in which a pair of the first and second sense nodes and a pair of the first and second bit lines are arranged at both sides of the sense amplifier.

17. The semiconductor memory device according to claim 10, further comprising an open type configuration in which the first and second sense nodes and the first and second bit lines are arranged only to one side of the sense amplifier.

18. The semiconductor memory device according to claim 10, further comprising an FBC connected to the first and second bit lines.

* * * * *